United States Patent

[11] 3,624,463

[72] Inventor Uryon Sahari Davidsohn
Scottsdale, Ariz.

[21] Appl. No. 867,193
[22] Filed Oct. 17, 1969
[45] Patented Nov. 30, 1971
[73] Assignee Motorola Inc.
Franklin Park, Ill.

[54] METHOD OF AND APPARATUS FOR INDICATING SEMICONDUCTOR ISLAND THICKNESS AND FOR INCREASING ISOLATION AND DECREASING CAPACITY BETWEEN ISLANDS
10 Claims, 6 Drawing Figs.

[52] U.S. Cl. .......... 317/234, 317/101, 317/235, 29/576
[51] Int. Cl. .......... H01l 19/00
[50] Field of Search .......... 317/234, 235, 101; 29/576

[56] References Cited

UNITED STATES PATENTS

| | | | |
|---|---|---|---|
| 3,312,879 | 4/1967 | Godejahn, Jr. | 317/234 |
| 3,332,137 | 7/1967 | Kenny | 317/235 X |
| 3,381,182 | 4/1968 | Thornton | 317/234 |
| 3,385,729 | 5/1968 | Larchian | 317/234 X |
| 3,412,296 | 11/1968 | Grebene | 317/234 |

*Primary Examiner*—James D. Kallam
*Attorney*—Mueller & Aichele

ABSTRACT: The thickness of a single crystal island, which forms part of a slab of material, is indicated by the number of lines appearing on the surface of the slab. Since the lines are edges of thin layers of an insulating material, the insulating layer or layers also act to isolate the single crystal islands from each other and also to reduce the capacity between the islands.

Figures 1A, 1B, 1C, 1D, 1E, 2:
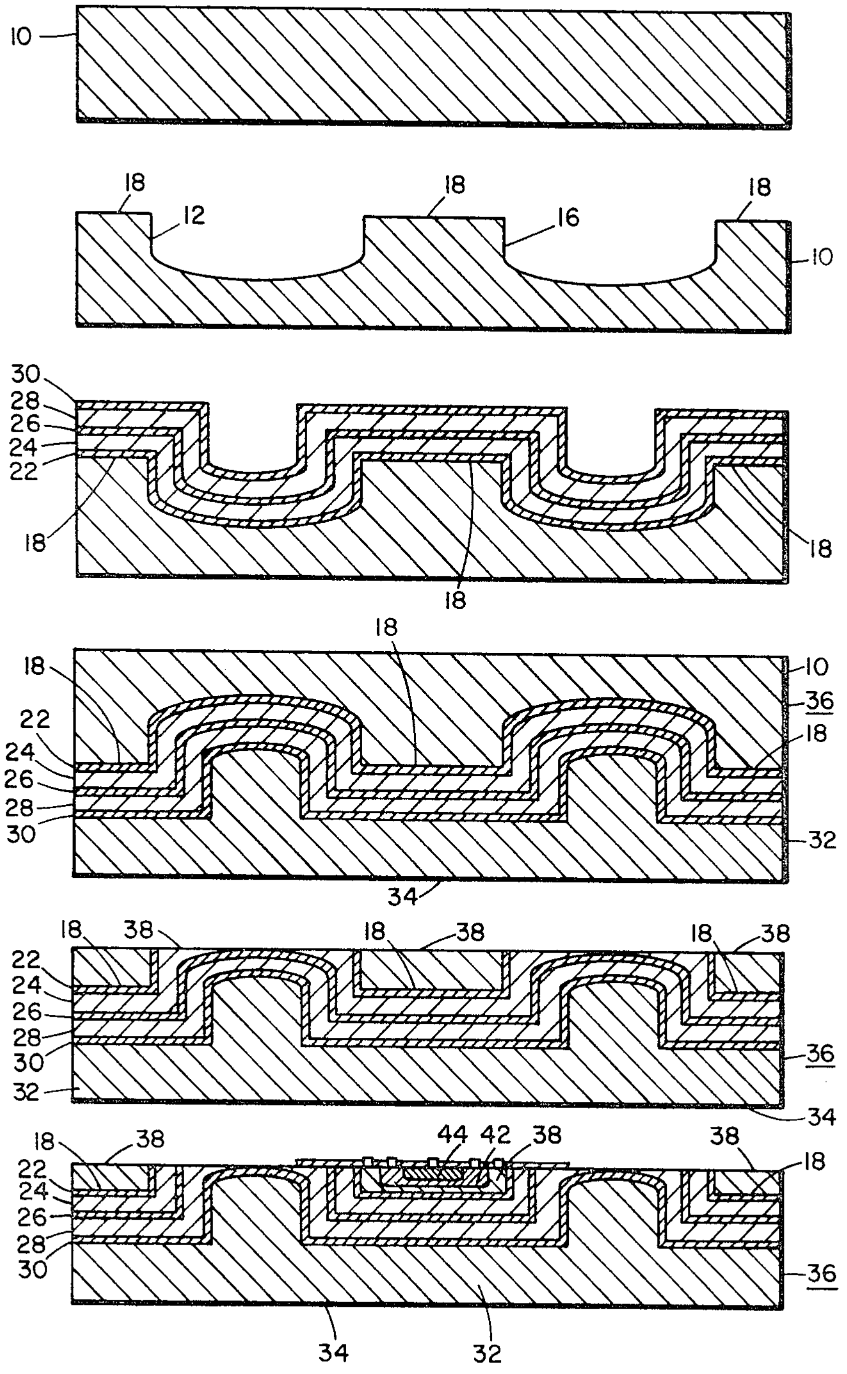

INVENTOR.
Uryon S. Davidsohn
BY
Mueller, Aichele & Rauner
ATTY'S

METHOD OF AND APPARATUS FOR INDICATING SEMICONDUCTOR ISLAND THICKNESS AND FOR INCREASING ISOLATION AND DECREASING CAPACITY BETWEEN ISLANDS

BACKGROUND

When a plurality of active or passive semiconductor devices, such as transistors, diodes or resistors, are formed as part of an integral slice of monocrystalline material, isolation between the several devices may become a problem. One manner in which this problem is solved is to fix to the slice, an insulating support backing or substrate and then cut through the material of the slice in accordance with a pattern that will provide isolated islands of monocyrstalline material and fill in the grooves left by the cutting action with an insulating material. The grooved surface of the composite layer is then ground down to produce a flat surface and is then lapped to provide a fine enough surface so that high-quality semiconductor elements may be provided by further treatment of the monocyrstalline islands. It is essential that the thickness of the islands be above a minimum value, not thicker than a value that would degrade semiconductor device performance and that the thickness of the several islands be uniform, if high-quality semiconductor devices of uniform quality are to be produced. It is difficult to tell the thickness of the islands since the backs thereof are inaccessible. Furthermore, due to the fact that the composite slab may not be of the same thickness throughout its volume, merely providing a flat parallel surface opposite the substrate surface will not necessarily provide islands of uniform thickness.

SUMMARY

In accordance with this invention, grooves are provided in one surface of a monocyrstalline slice of semiconductor materials. Then a thin layer of an insulating material is provided over the complete grooved surface including in the grooves. Then a thin layer of another material which may also be insulating material, but which is distinguishable from the first-mentioned insulating material, is provided over the first-insulating material. Then a further layer of the first-insulating material is provided over the other material and this alternate deposition of materials, at least one of which is insulating, is repeated as many times as is desired. Then, a backup layer or substrate is provided on the last deposited layer to provide support for the several layers and for the remaining monocrystalline portions or islands which comprises the composite slab. The so far unchanged surface of the composite slab is then ground down and polished until the same number of lines, which comprise the edges of insulating material layers, appears between the islands of monocyrstalline materials. It is then known that the thickness of the islands which are in the valleys provided by the projecting portions of the substrate are uniform even though the bottoms of the islands are inaccessible. Since the thickness of the alternately deposited layers may be very small and uniform, counting the lines between the islands will indicate the thickness of the island.

DESCRIPTION

The invention will be better understood upon reading the following description in connection with the accompanying drawing in which:

FIGS. 1A to 1E and 2 illustrate steps in the here disclosed inventive process, while FIG. 2 also illustrates a finished product using the composite slab of this invention.

For clarity purposes, each of the views illustrated in the several figures are shown in section. In FIG. 1A, the reference character 10 indicates a section of a slab of monocyrstalline semiconductor material such as silicon or germanium. As shown in FIG. 1B, grooves 12 and 16 are cut in one side, the upper side of the slab 10. While the grooves are shown as parallel and as extending perpendicular to the plane of the paper, they extend in any direction and they may cross each other to produce islands, such as the island 18 of FIG. 1B, of semiconductive material. Then, as shown in FIG. 1C, a plurality of thin layers are put on the complete surface of the slab 10 including the surface of the grooves 12 and 16 and of the islands 18 as well as the rest of the grooved surface. The first surface layer 22, which is deposited on the slab 10 may be of silicon dioxide. The next layer 24 may be of a material which is distinguishable from the silicon dioxides such as polycrystalline silicon. The third layer 26 may be silicon dioxide and the fourth layer 28 may again be polycrystalline silicon while the last layer 30 that is shown may be silicon dioxide. While five layers are shown, as many layers may be used as desired. Each layer may be a few microns thick.

As shown in FIG. 1D, a substrate 32 is provided for the slice 10 portions of this substrate 32, which may be polycrystalline silicon, filling the grooves still remaining after the application of the several layers 22, 24, 26, 28 and 30 and presenting a flat outer surface 34 to provide a composite slab 36. That is, projections on the substrate 32 project into the grooves remaining after the coating process mentioned hereinabove involving the layers 22, 24, 26, and 28 whereby the substrate 32 provides valleys into which portions of the polycrystalline layer 10 project. As will be noted, the slab 36 has been turned over in FIG. 1D.

FIG. 1E differs from FIG. 1D only in that the monocyrstalline part 10 of the composite slab 36 has been ground down to provide a flat surface tangent with the tops of the layer 26, whereby the islands 38 of monocyrstalline material, which is insulated from all of the other islands of monocyrstalline material, is provided in the valley of the substrate 32 and in the valley provided by the several layers 22, 24, 26, 28 and 30. The capacity between the several islands is also reduced due to the thickness of the insulation layers 22, 26 and 28 over the capacity effect between two portions of monocyrstalline material that is separated, in a known manner, merely by a PN-junction. If the layers 24 and 28 are conductive, the layers 22, 26 and 30 comprise three capacitors in series, whereby the capacity between the islands is the reciprocal of the sum of the inverse capacity of the several individual capacitors and is therefor much reduced.

In FIG. 2, the islands had been reduced in thickness by further lapping and grinding until the edges of the layers 22, 24, 26 and 28 are visible and the top of the layer 30 is also visible.

The thickness of all he islands, among which is island 38, are the same since the same number of lines appear between all the islands. Also, knowing the thickness of the several layers, the thickness of the islands such as the island 38 is also known.

Also as shown in FIG. 2, a base region 42 and an emitter region 44 have been formed in the islands including the island 38, the remainder of the island comprising the collector region, by known construction technique and connectors have been applied to the resultant transistor, which are now part of monocyrstalline islands such as the island 38. It is noted the islands 38 are of known thickness and they are fully insulated from all other islands such as 38, and the capacity effect between the several islands is greatly reduced over known constructions.

What is claimed is:

1. A method for determining the thickness of a plurality of islands of monocyrstalline material integrally formed in a semiconductor body and for simultaneously reducing the capacitance between adjacent islands, comprising the steps of:

providing a monocrystalline semiconductor body having at least an upper surface and a lower surface;

selectively removing portions of said body beginning at said upper surface and thereby forming a groove extending from said upper surface vertically into said body and extending transversely across said upper surface and forming a closed member for enclosing a plurality of monocyrstalline mesa segments in said body;

fashioning a depth-indicating set overlying said groove and said mesa segments and including two layers of materials at least a first insulating one adherent to said groove and said mesa segments;

said two layers being separated by a visually distinguishable interposed additional layer;

forming a substrate layer by filling said remaining portions of said groove and covering said depth-indicating set overlaying said mesa segments;

removing in a substantially uniform manner equal thickness of said body beginning at said lower surface for forming a plurality of islands from said mesa segments of said monocyrstalline semiconductor material and each island having a planar surface established as the result of such uniform removal of said body and forming a major surface, and for simultaneously exposing said insulating layer and a portion of said interposed layer of said depth-indicating set, and said exposed portion of said set being coplanar with and forming part of said major surface; and determining the depth of each island by visually inspecting said layers of material in said depth-indicating set being exposed by said last-mentioned removal step.

2. The method as recited in claim 1, and further including:

forming semiconductor devices in at least one of said islands.

3. The method as recited in claim 1, wherein said interposed additional layer further includes:

a plurality of visually distinguishable strata.

4. The method as recited in claim 3, and further comprising:

providing a monocrystalline semiconductor body of monocrystalline silicon; and employing alternate layers of silicon oxide and polycrystalline silicon in forming said strata.

5. In combination:

a body of semiconductor material having a major surface;

a plurality of islands of monocrystalline material and each island having a substantially uniform depth and having an upper surface substantially coplanar with the other upper surfaces of said islands;

each of said planar surfaces of said islands being coplanar with and forming part of said major surface;

a depth-indicating means including a plurality of layers enclosing each of said islands except for said upper surface of each respective island and at least a first one of said layers being an insulating layer;

said plurality of layers being formed having a cross sectional portion thereof coplanar with and forming part of said major surface;

each of said layers being of substantially known and uniform thickness and adjacent ones of said layers being visually distinguishable one from the other; and certain of said layers terminating on said major surface whereby the depth of said islands is determined by visual inspection of said terminations of said layers.

6. The combination as recited in claim 5 and further comprising:

a depth-indicating portion of one of said layers being displaceably positioned from said major surface and equidistant between adjacent islands and being aligned for representing a desired depth of corresponding ones of said islands; and said cross section portion being formed tangential with said depth-indicating portion.

7. The combination as recited in claim 6, wherein said monocrystalline material is silicon;

said two layers of insulating layers are silicon oxide; and said visually distinguishable strata are alternate layers of silicon oxide and polycrystalline silicon.

8. The combination as recited in claim 5, and further comprising:

at least one semiconductor device formed in at least one of said islands; and means for passivating said major surface having said semiconductor device formed therein.

9. The combination as recited in claim 5, wherein:

said monocrystalline material is silicon;

said plurality of layers are alternate layers of silicon oxide and polycrystalline silicon.

10. The combination as recited in claim 5, wherein said depth-indicating means comprises:

at least two layers of insulating material; and a plurality of visually distinguishable strata.

* * * * *